United States Patent
Cho et al.

(10) Patent No.: US 12,090,602 B2
(45) Date of Patent: *Sep. 17, 2024

(54) PLATEN ROTATION DEVICE

(71) Applicant: TAIWAN SEMICONDUCTOR MANUFACTURING COMPANY, LTD., Hsinchu (TW)

(72) Inventors: Bruce Cho, Hsinchu (TW); Chia-Ying Tien, Hsinchu (TW); Huang-Chu Ko, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 287 days.

This patent is subject to a terminal disclaimer.

(21) Appl. No.: 17/371,709

(22) Filed: Jul. 9, 2021

(65) Prior Publication Data

US 2021/0331286 A1  Oct. 28, 2021

Related U.S. Application Data (60) Continuation of application No. 16/740,809, filed on Jan. 13, 2020, now Pat. No. 11,072,051, which is a
(Continued)

(51) Int. Cl.
| | |
|---|---|
| H01L 21/67 | (2006.01) |
| B24B 1/00 | (2006.01) |
| B24B 37/005 | (2012.01) |
| B24B 37/04 | (2012.01) |
| B24B 37/10 | (2012.01) |
| B24B 47/12 | (2006.01) |

(Continued)

(52) U.S. Cl.
CPC ............... *B24B 47/12* (2013.01); *B24B 1/00* (2013.01); *B24B 37/005* (2013.01); *B24B 37/044* (2013.01); *B24B 37/10* (2013.01); *H01L 21/30625* (2013.01); *H01L 21/3212* (2013.01); *H02P 29/00* (2013.01)

(58) Field of Classification Search
None
See application file for complete search history.

(56) References Cited

U.S. PATENT DOCUMENTS

| | | |
|---|---|---|
| 5,904,609 A | 5/1999 | Fukuroda |
| 5,948,203 A | 9/1999 | Wang |
| (Continued) | | |

FOREIGN PATENT DOCUMENTS

| | | | | |
|---|---|---|---|---|
| JP | 2004195629 A | * | 7/2004 | ........... B24B 37/005 |

*Primary Examiner* — Sylvia MacArthur
(74) *Attorney, Agent, or Firm* — Hauptman Ham, LLP (57) ABSTRACT

A device includes a rotator assembly configured to control a rotational kinetic energy of a wafer-platen based on an electrical energy input. The device further includes a controller configured to control the rotational kinetic energy of the wafer-platen, wherein a rotational velocity of the wafer-platen is either increased or decreased. The device further includes a converter configured to generate an electrical energy output of the rotator assembly based on decreased rotational kinetic energy of the wafer-platen. The device further includes an energy storage device configured to store the electrical energy outputted by the rotator assembly based on the decreased rotational kinetic energy of the wafer-platen.

20 Claims, 4 Drawing Sheets

Related U.S. Application Data division of application No. 15/626,597, filed on Jun. 19, 2017, now Pat. No. 10,576,606.

(51) Int. Cl.
    *H01L 21/306*     (2006.01)
    *H01L 21/321*     (2006.01)
    *H01L 21/687*     (2006.01)
    *H02P 29/00*     (2016.01)

(56) References Cited

U.S. PATENT DOCUMENTS

| | | | |
|---|---|---|---|
| 6,062,949 A * | 5/2000 | Yashiki | B24B 37/042 |
| | | | 451/6 |
| 6,361,647 B1 | 3/2002 | Halley | |
| 10,322,487 B1 * | 6/2019 | Hansen | B24B 41/02 |
| 2004/0166773 A1 | 8/2004 | Tada | |
| 2013/0052917 A1 | 2/2013 | Park | |
| 2016/0271749 A1 | 9/2016 | Shinozaki | |
| 2017/0106493 A1 | 4/2017 | Takahashi | |
| 2018/0361535 A1 | 12/2018 | Cho | |
| 2021/0331286 A1 * | 10/2021 | Cho | B24B 37/10 |

* cited by examiner

PLATEN ROTATION DEVICE

PRIORITY CLAIM

The present application is a continuation of U.S. application Ser. No. 16/740,809, filed Jan. 13, 2020, which is a divisional of U.S. application Ser. No. 15/626,597, filed Jun. 19, 2017, now U.S. Pat. No. 10,576,606, issued Mar. 3, 2020, which are incorporated herein by reference in their entirety.

BACKGROUND

Integrated circuit (IC) manufacturing often includes operations that rely on rotating platens on which substrates or other objects are secured. For example, during chemical mechanical planarization (CMP) processing operations, chemical slurries are typically applied to IC wafers by a CMP polishing pad secured to a platen that is rotated while the wafers are positioned above the rotating pad.

Because a platen is usually stationary between polishing or other operations, the wafer processing operation is preceded by a period in which the platen rotational velocity is increased, i.e., ramped up, to one or more desired rotational velocities, and followed by a period in which the platen rotational velocity is decreased, i.e., ramped back down, to a stationary position.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a platen rotation apparatus includes a rotator assembly coupled with the platen. In a first mode of operation, the rotator assembly increases a rotational kinetic energy of the platen based on an electrical energy input, and, in a second mode of operation, the rotator assembly decreases the rotational kinetic energy of the platen and generates an electrical energy output based on the decreased rotational kinetic energy of the platen, thereby capturing energy that is dissipated as heat in other approaches. In some embodiments, a storage device stores the electrical energy output by the rotator assembly for future use.

Figure 1:
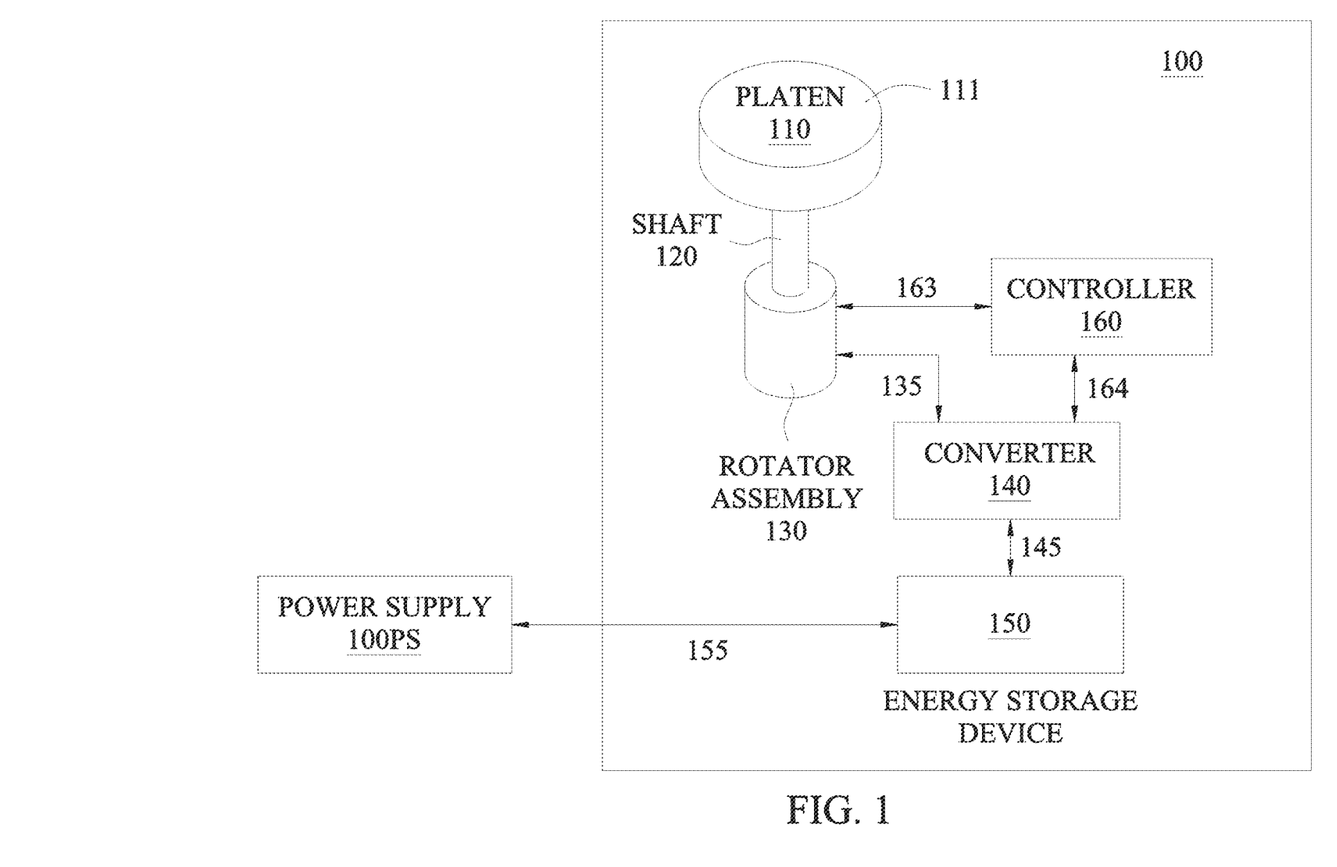
FIG. 1 is a diagram of a platen rotation system, in accordance with some embodiments.

FIG. 1 is a diagram of a platen rotation system 100, in accordance with some embodiments. In addition to platen rotation system 100, FIG. 1 depicts a power supply 100PS. Platen rotation system 100 is also called platen rotation apparatus 100.

Platen rotation system 100 includes a platen 110, a shaft 120, a rotator assembly 130, a converter 140, an energy storage device 150, and a controller 160. An electrical connection 135 electrically connects rotator assembly 130 with converter 140, an electrical connection 145 electrically connects converter 140 with energy storage device 150, and an electrical connection 155 electrically connects energy storage device 150 with power supply 100PS. A communication link 163 communicatively couples controller 160 with rotator assembly 130 and a communication link 164 communicatively couples controller 160 with converter 140. In some embodiments, communication link 163 electrically couples controller 160 with rotator assembly 130 and communication link 164 electrically couples controller 160 with converter 140.

Platen 110 is a rotatable disk having a substantially planar upper surface or upper surface portion 111. Platen 110 is capable of applying a force throughout and normal to the upper surface or upper surface portion 111 while being rotated. Platen 110 includes one or more metals or other materials having rigidity and strength sufficient to apply the normal force throughout the upper surface or upper surface portion 111 while being rotated. In some embodiments, platen 110 is oriented so that the normal force is applied in an upward direction. In some embodiments, platen 110 is oriented so that the normal force is applied in a downward direction.

In some embodiments, upper surface or upper surface portion 111 is configured to secure an object mounted on platen 110. In some embodiments, upper surface or upper surface portion 111 is a smooth surface suitable for application of an adhesive for securing an object such as a CMP polishing pad.

In some embodiments, upper surface or upper surface portion 111 is a smooth surface suitable for securing a substrate such as a semiconductor wafer. In some embodiments, platen 110 includes one or more components capable of securing a substrate or other object on upper surface or upper surface portion 111. In some embodiments, platen 110 includes elements of a vacuum or electrostatic assembly capable of securing a substrate or other object on upper surface or upper surface portion 111. In some embodiments, platen 110 includes one or more mechanical elements or assemblies, e.g. clips or fasteners, capable of securing a substrate or other object on upper surface or upper surface portion 111.

In some embodiments, upper surface or upper surface portion 111 includes one or more holes configured to apply a vacuum for securing an object on platen 110. In some embodiments, platen 110 includes one or more ejector pins, and upper surface or upper surface portion 111 includes one or more holes configured to allow movement of the ejector pins for removing an object from upper surface or upper surface portion 111.

In some embodiments, platen 110 includes one or more components capable of controlling a temperature of upper surface or upper surface portion 111.

In some embodiments, platen 110 has a diameter of about 4-36 inches. In some embodiments, platen 110 has a diameter of about 20-30 inches. In some embodiments, platen 110 has a diameter of about 8-18 inches.

In operation, platen 110 has a rotational kinetic energy corresponding to a rotational velocity of platen 110. The rotational velocity of platen 110 has a magnitude and a direction. In addition to the rotational velocity, the rotational kinetic energy is based on an inertial mass of platen 110 and a distribution of the inertial mass. In some embodiments, the rotational kinetic energy of platen 110 includes the rotational kinetic energy of one or more objects secured to platen 110. In some embodiments, platen 110 is capable of having rotational kinetic energy corresponding to rotational velocities of 0-300 revolutions per minute (rpm).

In some embodiments, platen rotation system 100 is part of a wafer processing system and, in operation, an object secured to platen 110 is subjected to forces, e.g. frictional forces, that act to reduce a magnitude of the rotational velocity of platen 110. In some embodiments, platen 110 has an inertial mass sufficiently large to reduce the effect of such forces so that the magnitude of the rotational velocity of platen 110 is not significantly reduced during wafer processing operations.

Shaft 120 is a rotatable cylinder capable of applying a torque to platen 110 so as to control the rotational velocity of platen 110. In some embodiments, shaft 120 has a shape other than cylindrical. In some embodiments, shaft 120 includes multiple mechanical components.

Shaft 120 includes one or more metals or other materials having rigidity and strength sufficient to apply torque to platen 110 that is capable of controlling acceleration and deceleration of the inertial mass of platen 110, thereby controlling the rotational velocity of platen 110.

Shaft 120 is mechanically coupled with platen 110. In some embodiments, shaft 120 is removably coupled with platen 110 by mounting hardware such as one or more screws, clamps, or other similar mounting mechanisms. In some embodiments, shaft 120 is affixed to platen 110 by a weld or similar joint.

In some embodiments, shaft 120 and platen 110 are a single element. In some embodiments, platen rotation system 100 does not include shaft 120, and platen 110 is directly connected to rotator assembly 130.

Rotator assembly 130 is an electromechanical assembly configured to receive an electrical energy input from electrical connection 135, generate an electrical energy output on electrical connection 135, receive one or more control signals from controller 160 on communication link 163, and control the rotational velocity of platen 110 based on the one or more control signals. In some embodiments, rotator assembly 130 is configured to output one or more status signals on communication link 163 to controller 160.

Rotator assembly 130 is configured to operate in a first mode corresponding to receiving electrical energy input and in a second mode corresponding to generating electrical energy output.

In the first mode, rotator assembly 130 is configured to convert the received electrical energy from converter 140 into the rotational kinetic energy of platen 110. In operation, rotation of platen 110 is opposed by frictional forces and, in some embodiments, forces generated by wafer processing activities. In operation, the rotational kinetic energy of platen 110 therefore increases if the received electrical energy is sufficient to overcome the various forces, or maintains a constant level if the received electrical energy balances the opposing forces.

In operation, an amount of rotational kinetic energy imparted to platen 110 by rotator assembly 130 in the first mode corresponds to an amount of electrical energy received by rotator assembly 130 and an efficiency by which rotator assembly 130 converts the electrical energy to the rotational kinetic energy of platen 110.

In the second mode, rotator assembly 130 is configured to convert the rotational kinetic energy of platen 110 into the electrical energy output. In operation, an amount of the electrical energy output corresponds to an amount of a reduction in the rotational kinetic energy of platen 110 and an efficiency by which rotator assembly 130 converts the rotational kinetic energy of platen 110 into the electrical energy output.

In some embodiments, rotator assembly 130 is configured to switch between the first mode and the second mode based on the one or more control signals received from communication link 163. In some embodiments, rotator assembly 130 includes a user interface (not shown) and is configured to switch between the first mode and the second mode based on user input received through the user interface.

In some embodiments, rotator assembly 130 is configured to automatically switch between the first mode and the second mode independently of the one or more control signals received from communication link 163. In some embodiments, rotator assembly 130 is configured to automatically switch between the first mode and the second mode based on a timing algorithm.

In some embodiments, in operation, rotator assembly 130 switching between the first mode and the second mode corresponds to a change in the direction of the rotational velocity of platen 110.

In some embodiments, rotator assembly 130 includes a first assembly configured to operate in the first mode and a second, separate assembly configured to operate in the second mode. In some embodiments, rotator assembly 130 includes a single assembly configured to operate in both the first mode and the second mode. In some embodiments, rotator assembly 130 includes a single assembly configured to operate as a motor in the first mode and as a generator in the second mode.

In some embodiments, rotator assembly 130 includes a motor such as an induction motor, a permanent magnet synchronous motor, or another type of motor capable of converting electrical energy input into rotational kinetic energy as output.

In some embodiments, rotator assembly 130 includes a generator such as a motor or another type of electromechanical assembly capable of converting received rotational kinetic energy into electrical energy as output.

In some embodiments, rotator assembly 130 is configured to receive and/or output electrical energy in an alternating current (AC) waveform. In some embodiments, rotator assembly 130 is configured to receive and/or output electrical energy in a single-phase AC waveform. In some embodiments, rotator assembly 130 is configured to receive and/or output electrical energy in a two-phase AC waveform. In some embodiments, rotator assembly 130 is configured to receive and/or output electrical energy in a three-phase AC waveform.

In some embodiments, rotator assembly 130 is configured to receive and/or output electrical energy in a direct current (DC) waveform.

Rotator assembly 130 is mechanically coupled with shaft 120. In some embodiments, rotator assembly 130 is removably coupled with shaft 120 by mounting hardware such as one or more screws or clamps. In some embodiments, rotator assembly 130 is affixed to shaft 120 by a weld or similar joint.

In some embodiments, shaft 120 is part of rotator assembly 130. In some embodiments, platen rotation system 100 does not include shaft 120, and rotator assembly 130 includes platen 110. In some embodiments, platen rotation system 100 does not include shaft 120, and rotator assembly 130 is magnetically coupled with platen 110.

Converter 140 is an assembly configured to receive and output electrical energy on electrical connection 135, receive and output electrical energy on electrical connection 145, and receive one or more control signals from controller 160 on communication link 164. In some embodiments, converter 140 is configured to output one or more status signals to controller 160 on communication link 164.

Converter 140 is configured to convert electrical energy from a waveform corresponding to the electrical energy output from rotator assembly 130 to a waveform corresponding to electrical energy received by energy storage device 150, and to convert electrical energy from a waveform corresponding to electrical energy output from energy storage device 150 to a waveform corresponding to electrical energy received by rotator assembly 130.

In some embodiments, converter 140 is configured to convert electrical energy between an AC waveform and a DC waveform. In some embodiments, converter 140 is configured to convert electrical energy between a first AC waveform and a second AC waveform different from the first AC waveform. In some embodiments, converter 140 is configured to convert electrical energy between a first DC waveform and a second DC waveform different from the first DC waveform.

Converter 140 is configured to operate in a first mode in which electrical energy is received on electrical connection 145 and output on electrical connection 135, and a second mode in which electrical energy is received on electrical connection 135 and output on electrical connection 145.

In some embodiments, converter 140 is configured to detect electrical energy on electrical connections 135 and 145, and automatically switch between the first mode and the second mode based on the detected electrical energy. In some embodiments, converter 140 is configured to switch between the first mode and the second mode based on one or more control signals received from controller 160 on communication link 164.

In some embodiments, platen rotation system 100 does not include controller 160 and communication links 163 and 164, and one or both of rotator assembly 130 or converter 140 is configured to receive one or more control signals from a source external to platen rotation system 100. In some embodiments, platen rotation system 100 does not include controller 160 and communication links 163 and 164, and one or both of rotator assembly 130 or converter 140 includes a user interface and is configured to receive one or more control signals from the user interface.

Electrical connection 135 includes one or more electrical conductors configured to bi-directionally transfer electrical energy between rotator assembly 130 and converter 140, thereby electrically coupling rotator assembly 130 with converter 140. Electrical connection 145 includes one or more electrical conductors configured to bi-directionally transfer electrical energy between converter 140 and energy storage device 150, thereby electrically coupling converter 140 with energy storage device 150.

The combination of electrical connection 135, converter 140, and electrical connection 145 electrically couples rotator assembly 130 with energy storage device 150. In some embodiments, platen rotation system 100 does not include converter 140, and electrical connection 135 electrically couples rotator assembly 130 with energy storage device 150.

Energy storage device 150 is an assembly configured to receive, store, and output energy. Energy storage device 150 is configured to receive and output energy on electrical connection 145 as electrical energy. In some embodiments, energy storage device 150 is configured to receive and output energy on electrical connection 145 as electrical energy having an AC waveform. In some embodiments, energy storage device 150 is configured to receive and output energy on electrical connection 145 as electrical energy having a DC waveform.

In some embodiments, energy storage device 150 is configured to store energy as chemical energy. In some embodiments, energy storage device 150 is configured to store energy as electrical energy. In some embodiments, energy storage device 150 is configured to store energy as mechanical energy. In some embodiments, energy storage device 150 is configured to store energy as potential energy.

In some embodiments, energy storage device 150 includes a battery. In some embodiments, energy storage device 150 includes a supercapacitor or another element capable of storing an electric charge.

In some embodiments, energy storage device 150 is configured to receive and output energy on electrical connection 155 as electrical energy. In some embodiments, energy storage device 150 is configured to receive energy on electrical connection 155 and is not capable of outputting energy on electrical connection 155.

Electrical connection 155 includes one or more electrical conductors configured to bi-directionally transfer electrical energy between energy storage device 150 and an external power source such as power supply 100PS, thereby electrically coupling energy storage device 150 with the external power source. In some embodiments, electrical connection 155 includes one or more electrical conductors configured to uni-directionally transfer electrical energy from power supply 100PS to energy storage device 150.

In some embodiments, platen rotation system 100 does not include energy storage device 150, and electrical connection 155 is configured to electrically couple one or both of rotator assembly 130 or converter 140 with the external power source.

In some embodiments, the external power source is a power grid configured to operate as both a power source and a power recipient such that electrical energy output from one or more of rotator assembly 130, converter 140, or energy storage device 150 is captured by the power grid.

Controller 160 is a circuit or assembly configured to control the rotational velocity of platen 110 by generating the one or more control signals on communication link 163. In some embodiments, controller 160 is configured to control the rotational velocity of platen 110 based on one or more predetermined rotational velocity values. In some embodiments, controller 160 is configured to control the rotational velocity of platen 110 based on one or more user input rotational velocity values. In some embodiments, controller 160 includes a user interface (not shown) configured to receive the one or more user input rotational velocity values.

In some embodiments, controller 160 includes a processor. In some embodiments, controller 160 includes processor 402, discussed below with respect to system 400 and FIG. 4. In some embodiments, controller 160 is configured to receive one or more rotational velocity values from a controller or other circuit (not shown) external to platen rotation system 100.

In some embodiments, controller 160 is configured to receive one or more status signals generated by rotator assembly 130 on electrical connection 135. In some embodiments, the one or more status signals include indications of one or both of the status of the mode of rotator assembly 130 or the rotational velocity of platen 110.

In some embodiments, controller 160 is configured to receive one or more status signals generated by converter 140 on electrical connection 145. In some embodiments, the one or more status signals include an indication of the mode of converter 140.

In some embodiments, controller 160 is configured to generate the one or more control signals based on one or more status signals generated by rotator assembly 130 and/or converter 140.

In some embodiments, controller 160 is configured to generate the one or more control signals to cause rotator assembly 130 to switch between the first mode and the second mode. In some embodiments, controller 160 is configured to generate the one or more control signals to cause converter 140 to switch between the first mode and the second mode. In some embodiments, controller 160 is configured to generate the one or more control signals to cause rotator assembly 130 and converter 140 to simultaneously switch between respective first modes and second modes.

Each of communication links 163 and 164 includes one or more wired or wireless signal paths capable of communicating the control and/or status signals between controller 160 and a respective one of rotator assembly 130 or converter 140.

In some embodiments, platen rotation system 100 does not include controller 160 and one or both of rotator assembly 130 or converter 140 is configured to receive one or more control signals from a controller or other circuit (not shown) external to platen rotation system 100.

In some embodiments, platen rotation system 100 is part of a wafer processing system. In some embodiments, platen rotation system 100 is part of a CMP processing system.

By the configuration described above, in operation, platen rotation system 100 is usable to capture a portion of the rotational kinetic energy of platen 110 from a given processing operation and reuse a portion of the captured energy in a subsequent processing operation. Compared to other approaches in which a portion of the rotational kinetic energy of a platen is not captured, for example approaches in which rotational kinetic energy is dissipated as heat, platen rotation system 100 enables operation with improved energy efficiency. For example, in a CMP processing application, a reduction in energy usage of up to 70 percent is possible.

Figure 2:
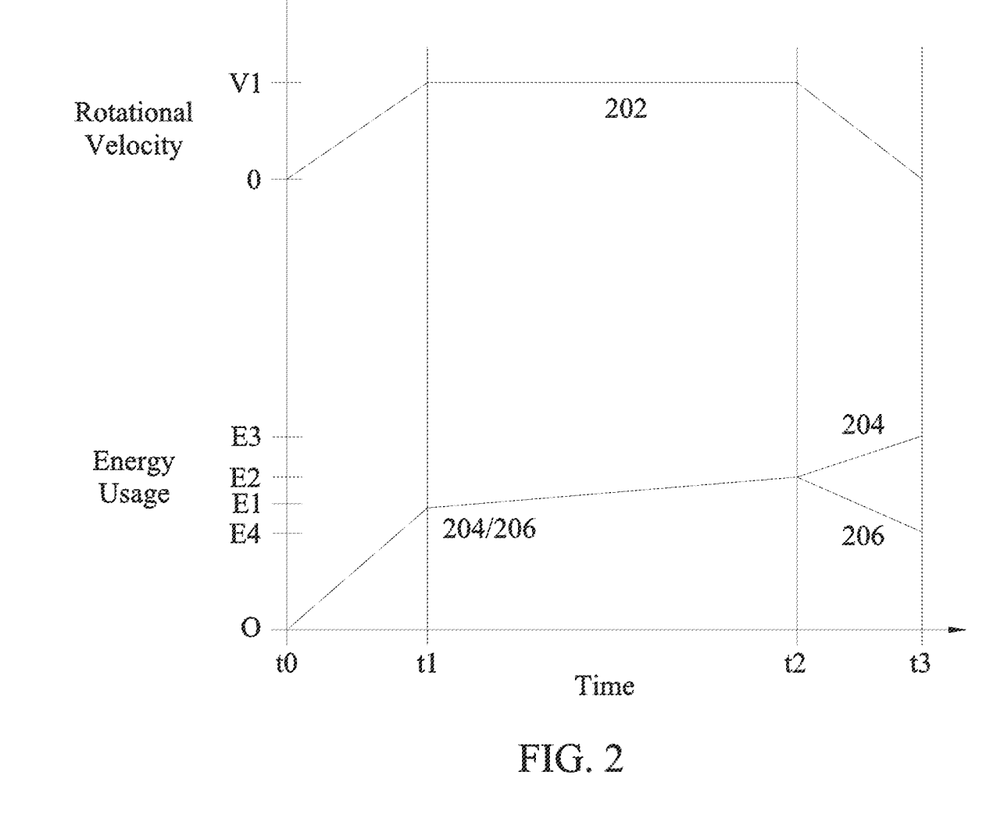
FIG. 2 is a diagram of a timeline of a platen rotation operation, in accordance with some embodiments.

FIG. 2 is a diagram of a timeline of a platen rotation operation, in accordance with some embodiments. FIG. 2 depicts time on the x-axis and both rotation velocity and energy usage on the y-axis.

Curve 202 is a representation of a rotational velocity of a platen, for example platen 110, discussed above with respect to platen rotation system 100 and FIG. 1. Curve 204 is a representation of an energy usage of a processing system in which rotational kinetic energy of a platen is not captured. Curve 206 is a representation of an energy usage of a processing system in which rotational kinetic energy of a platen is captured for reuse, for example platen rotation system 100 discussed above with respect to FIG. 1.

At time t0, the platen has a rotational velocity of zero, and the energy usage has an initial value of zero. Between times t0 and t1, the rotational velocity of the platen increases to a rotational velocity value V1, and the energy usage increases to energy usage value E1 for both of curves 204 and 206.

Between times t1 and t2, the rotational velocity of the platen is maintained at rotational velocity value V1, and the energy usage increases to energy usage value E2 for both of curves 204 and 206. Energy usage value E2 is greater than energy usage value E1, reflecting the energy required to offset forces opposing platen rotation from one or more processing operations taking place during the period from t1 to t2.

Between times t2 and t3, the rotational velocity of the platen decreases from rotational velocity value V1 to zero.

During the time period from time t2 to time t3, energy usage represented by curve 204 increases to energy usage value E3. The increase from energy usage value E2 to energy usage value E3 is due to energy required to reduce the rotational velocity of the platen from V1 to zero.

During the time period from time t2 to time t3, energy usage represented by curve 206 decreases to energy usage value E4. The decrease from energy usage value E2 to energy usage value E4 is due to capture of the energy from reducing the rotational velocity of the platen from V1 to zero. This captured energy is available for storage in an energy storage device, e.g. energy storage device 150, or for return to a power grid.

Figure 3:
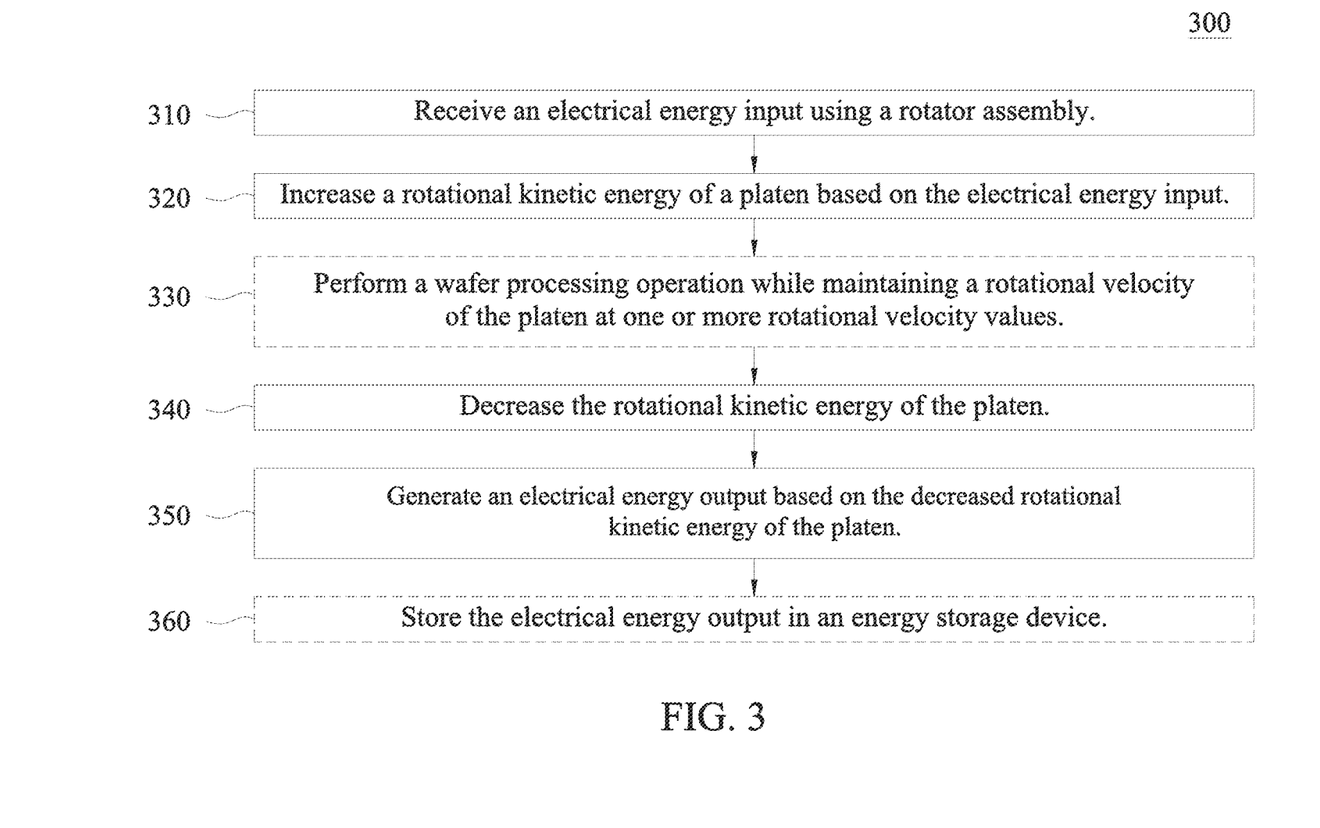
FIG. 3 is a flowchart of a method of rotating a platen, in accordance with some embodiments.

FIG. 3 is a flowchart of a method 300 of controlling platen rotation, in accordance with one or more embodiments. In some embodiments, method 300 is a method of controlling rotation of a platen of a CMP polishing system. Method 300 is implemented using a platen rotation system such as platen rotation system 100, discussed above with respect to FIG. 1.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between and/or after the operations depicted in FIG. 3.

At operation 310, a rotator assembly receives an electrical energy input. In some embodiments, the rotator assembly receiving the electrical energy input is rotator assembly 130, discussed above with respect to platen rotation system 100 and FIG. 1. In some embodiments, the rotator assembly receiving the electrical energy input includes the rotator assembly receiving the electrical energy input from a storage device. In some embodiments, the rotator assembly receiving the electrical energy input includes the rotator assembly receiving the electrical energy input from storage device 150, discussed above with respect to platen rotation system 100 and FIG. 1.

In some embodiments, the rotator assembly receiving the electrical energy input includes converting the electrical energy input from a first waveform to a second waveform. In some embodiments, the rotator assembly receiving the electrical energy input includes converting the electrical energy input from a first waveform to a second waveform using converter 140, discussed above with respect to platen rotation system 100 and FIG. 1. In some embodiments, the rotator assembly receiving the electrical energy input includes converting the electrical energy input from a DC waveform to an AC waveform.

At operation 320, the rotator assembly increases a rotational kinetic energy of a platen based on the electrical energy input. In some embodiments, increasing the rotational kinetic energy of the platen includes increasing the rotational kinetic energy of platen 110, discussed above with respect to platen rotation system 100 and FIG. 1.

In some embodiments, increasing the rotational kinetic energy of the platen includes ramping up a rotational velocity of the platen from zero to one or more rotational velocity values. In some embodiments, increasing the rotational kinetic energy of the platen includes ramping up the rotational velocity of the platen from zero to one or more predetermined rotational velocity values. In some embodiments, increasing the rotational kinetic energy of the platen includes ramping up the rotational velocity of the platen from zero to one or more rotational velocity values based on user input.

In some embodiments, increasing the rotational kinetic energy of the platen includes ramping up a rotational velocity of the platen from zero to rotational velocity V1 from time t0 to time t1, discussed above with respect to FIG. 2.

In some embodiments, increasing the rotational kinetic energy of the platen includes increasing the rotational kinetic energy of the platen based on one or more control signals. In some embodiments, increasing the rotational kinetic energy of the platen includes increasing the rotational kinetic energy of the platen based on one or more control signals generated by controller 160, discussed above with respect to platen rotation system 100 and FIG. 1. In some embodiments, increasing the rotational kinetic energy of the platen includes increasing the rotational kinetic energy of the platen based on one or more control signals generated by processor 402, discussed below with respect to system 400 and FIG. 4. In some embodiments, increasing the rotational kinetic energy of the platen includes increasing the rotational kinetic energy of the platen based on one or more control signals generated by a wafer processing system, such as a CMP polishing system.

At operation 330, in some embodiments, a wafer processing operation is performed while the rotator assembly maintains the rotational velocity of the platen at one or more of the one or more rotational velocity values. In some embodiments, a CMP processing operation is performed while the rotator assembly maintains the rotational velocity of the platen at one or more of the one or more rotational velocity values.

In some embodiments, a wafer processing operation is performed while the rotator assembly maintains the rotational velocity of the platen at rotational velocity value V1 from time t1 to time t2, discussed above with respect to FIG. 2.

At operation 340, the rotator assembly decreases a rotational kinetic energy of the platen. In some embodiments, the rotator assembly decreasing the rotational kinetic energy of the platen includes rotator assembly 130 decreasing the rotational kinetic energy of platen 110, discussed above with respect to platen rotation system 100 and FIG. 1.

In some embodiments, decreasing the rotational kinetic energy of the platen includes ramping down a rotational velocity of the platen from the one or more rotational velocity values to zero. In some embodiments, decreasing the rotational kinetic energy of the platen includes ramping down the rotational velocity of the platen from the one or more predetermined rotational velocity values to zero. In some embodiments, decreasing the rotational kinetic energy of the platen includes ramping down the rotational velocity of the platen from the one or more rotational velocity values to zero based on user input.

In some embodiments, decreasing the rotational kinetic energy of the platen includes ramping down the rotational velocity of the platen from rotational velocity V1 to zero from time t2 to time t3, discussed above with respect to FIG. 2.

In some embodiments, decreasing the rotational kinetic energy of the platen includes decreasing the rotational kinetic energy of the platen based on one or more control signals. In some embodiments, decreasing the rotational kinetic energy of the platen includes decreasing the rotational kinetic energy of the platen based on one or more control signals generated by controller 160, discussed above with respect to platen rotation system 100 and FIG. 1. In some embodiments, decreasing the rotational kinetic energy of the platen includes decreasing the rotational kinetic energy of the platen based on one or more control signals generated by processor 402, discussed below with respect to system 400 and FIG. 4. In some embodiments, decreasing the rotational kinetic energy of the platen includes decreasing the rotational kinetic energy of the platen based on one or more control signals generated by a wafer processing system, such as a CMP polishing system.

In some embodiments, decreasing the rotational kinetic energy of the platen includes switching the rotator assembly from a first mode, in which electrical energy is converted to mechanical energy, to a second mode, in which mechanical energy is converted to electrical energy. In some embodiments, the rotator assembly switches from the first mode to the second mode based on one or more control signals. In some embodiments, the rotator assembly switches from the first mode to the second mode based on one or more control signals generated by controller 160, discussed above with respect to platen rotation system 100 and FIG. 1. In some embodiments, the rotator assembly switches from the first mode to the second mode based on one or more control signals generated by processor 402, discussed below with respect to system 400 and FIG. 4. In some embodiments, the rotator assembly switches from the first mode to the second mode based on one or more control signals generated by a wafer processing system, such as a CMP polishing system. In some embodiments, the rotator assembly switches from the first mode to the second mode automatically.

At operation 350, the rotator assembly generates an electrical energy output based on the decreased rotational kinetic energy of the platen. In some embodiments, rotator assembly 130 generates an electrical energy output based on the decreased rotational kinetic energy of platen 110, discussed above with respect to platen rotation system 100 and FIG. 1.

In some embodiments, the rotator assembly generating an electrical energy output includes outputting the electrical energy output to a power grid.

At operation 360, in some embodiments, the electrical energy output is stored in an energy storage device. In some embodiments, storing the electrical energy output in the energy storage device includes storing the electrical energy output in energy storage device 150, discussed above with respect to platen rotation system 100 and FIG. 1.

In some embodiments, storing the electrical energy output in the energy storage device includes converting the electrical energy output from a first waveform to a second waveform. In some embodiments, storing the electrical energy output in the energy storage device includes converting the electrical energy output from a first waveform to a second waveform using converter 140, discussed above with respect to platen rotation system 100 and FIG. 1. In some embodiments, storing the electrical energy output in the energy storage device includes converting the electrical energy output from an AC waveform to a DC waveform.

By executing the operations of method 300, a portion of the rotational kinetic energy of platen from a given processing operation is captured and available for reuse in a different or subsequent processing operation. Compared to other approaches in which a portion of the rotational kinetic energy of a platen is not captured, for example approaches in which rotational kinetic energy is dissipated as heat, method 300 enables operation with improved energy efficiency. For example, in a CMP processing application, a reduction in energy usage of up to 70 percent is possible.

Figure 4:
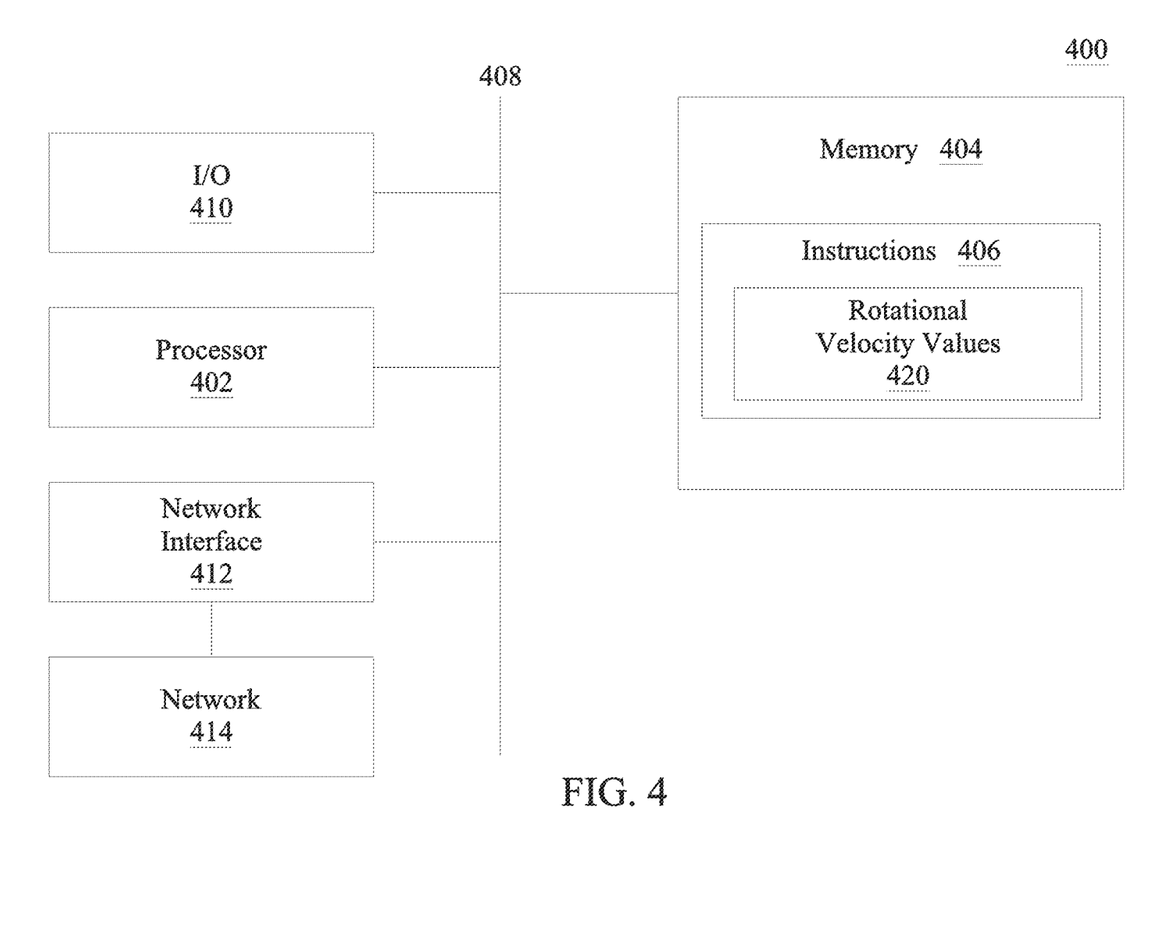
FIG. 4 is a schematic view of a system for controlling a platen rotation apparatus, in accordance with some embodiments.

FIG. 4 a schematic view of a system 400 for controlling a platen rotation apparatus, in accordance with some embodiments. In some embodiments, system 400 is part of a wafer processing system. In some embodiments, system 400 is part of a CMP processing system.

System 400 includes a hardware processor 402 and a non-transitory, computer readable storage medium 404 encoded with, i.e., storing, the computer program instructions 406, i.e., a set of executable instructions. Instructions 406 include instructions for controlling platen rotation. The processor 402 is electrically coupled with the computer readable storage medium 404 via a bus 408. The processor 402 is also electrically coupled with an I/O interface 410 by bus 408. A network interface 412 is also electrically connected to the processor 402 via bus 408. Network interface 412 is connected to a network 414, so that processor 402 and computer readable storage medium 404 are capable of connecting to external elements via network 414. The processor 402 is configured to execute the computer program instructions 406 encoded in the computer readable storage medium 404 in order to cause system 400 to be usable for performing a portion or all of the operations as described in method 300.

In some embodiments, the processor 402 is a central processing unit (CPU), a multi-processor, a distributed processing system, an application specific integrated circuit (ASIC), and/or a suitable processing unit.

In some embodiments, the computer readable storage medium 404 is an electronic, magnetic, optical, electromagnetic, infrared, and/or a semiconductor system (or apparatus or device) for storing instructions and/or data in a non-transitory manner. For example, the computer readable storage medium 404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 404 includes a compact disk-read only memory (CD-ROM), a compact disk-read/write (CD-R/W), and/or a digital video disc (DVD).

In some embodiments, the computer readable storage medium 404 stores the computer program instructions 406 configured to cause system 400 to perform a portion or all of method 300. In some embodiments, the computer readable storage medium 404 also stores information needed for performing method 400 as well as information generated during the performance of the method 300, such as rotational velocity values 420, and/or a set of executable instructions to perform the operation of method 300.

System 400 includes I/O interface 410. I/O interface 410 is coupled with external circuitry. In some embodiments, I/O interface 410 includes a keyboard, keypad, mouse, trackball, trackpad, and/or cursor direction keys for communicating information and/or commands to processor 402.

System 400 also includes network interface 412 coupled with the processor 402. Network interface 412 allows system 400 to communicate with network 414, to which one or more other computer systems are connected. Network interface 412 includes wireless network interfaces such as BLUETOOTH, WIFI, WIMAX, GPRS, or WCDMA; or wired network interface such as ETHERNET, USB, or IEEE-1394. In some embodiments, method 300 is implemented in two or more systems 400, and information such as rotational velocity values are exchanged between different systems 400 via network 414.

System 400 is configured to receive information related to controlling platen rotation. The information is transferred to processor 402 via bus 408 and is then stored in computer readable storage medium 404 as rotational velocity values 420. In some embodiments, the pad removal operations are accessed in operation 320 (FIG. 3).

By being configured to execute a portion or all of method 300, system 400 enables the realization of the advantages discussed above with respect to platen rotation system 100, method 300, and FIGS. 1-3.

In some embodiments, a device includes a rotator assembly configured to control a rotational kinetic energy of a wafer-platen based on an electrical energy input. The device further includes a controller configured to control the rotational kinetic energy of the wafer-platen, wherein a rotational velocity of the wafer-platen is either increased or decreased. The device further includes a converter configured to generate an electrical energy output of the rotator assembly based on decreased rotational kinetic energy of the wafer-platen. The device further includes an energy storage device configured to store the electrical energy outputted by the rotator assembly based on the decreased rotational kinetic energy of the wafer-platen.

Implementations may include one or more of the following features. The device includes a shaft configured to apply a torque and control the rotational velocity of the wafer-platen. The shaft is configured to be removably coupled with the wafer-platen. The wafer-platen is configured for a wafer processing system. The wafer processing system is part of a chemical mechanical planarization (CMP) processing system. The device includes a user interface configured to receive one or more rotational velocity values to either increase or decrease the rotational velocity of the wafer-platen. The rotator assembly is configured to receive the one or more rotational velocity values from the user interface.

In some embodiments, a platen rotation device includes a rotator assembly configured to receive an electrical energy input and control a rotational kinetic energy of a shaft coupled to the rotator assembly based on the electrical energy input. The device further includes a wafer-platen configured to rotate based on the rotational kinetic energy input at the shaft. The device further includes a controller configured to control the electrical energy input to the rotator assembly to increase electrical energy values or decrease the electrical energy values. The device further includes a converter configured to generate an electrical energy output of the rotator assembly based on decreased rotational kinetic energy of the wafer-platen when the electrical energy values from the controller are decreased. The device further includes an energy storage device configured to supply the electrical energy input to the rotator assembly and receive the electrical energy generated from the decreased rotational kinetic energy of the wafer-platen.

Implementations may include one or more of the following features. The platen rotation device where the rotator assembly is configured to receive one or more rotational velocity values from the controller. The converter is configured to automatically switch between transferring energy from the energy storage device to the rotator assembly and transferring the decreased rotational kinetic energy to the energy storage device. The converter is configured to switch between transferring energy from the energy storage device to the rotator assembly and transferring the decreased rotational kinetic energy to the energy storage device based on a control signal. The platen rotation device further includes a user interface that switches between transferring energy from the energy storage device to the rotator assembly and transferring the decreased rotational kinetic energy to the energy storage device based on user input received through the user interface. The platen rotation device further includes a user interface increases the rotational kinetic energy to ramp up rotational velocity of the wafer-platen from zero to one or more rotational velocity values based on user input.

In some embodiments, a device includes a rotator assembly configured to control a rotational kinetic energy of a wafer-platen based on an electrical energy input. Where a rotational velocity of the wafer-platen is either increased or decreased. The device further includes a converter configured to generate an electrical energy output of the rotator assembly based on a decreased rotational kinetic energy of the wafer-platen when the rotational velocity is decreased. The device further includes an energy storage device configured to store the electrical energy outputted by the rotator assembly based on the decreased rotational kinetic energy of the wafer-platen.

Implementations may include one or more of the following features. The device includes a controller configured to control the rotational kinetic energy of the wafer-platen based on one or more control signals transferred to the rotator assembly. The controller is configured to ramp up the rotational kinetic energy from zero to the one or more rotational velocity values or ramp down the rotational kinetic energy from the one or more rotational velocity values to zero. The controller where the controller is configured to perform a wafer processing operation that includes the wafer-platen rotating at the one or more rotational velocity values. The wafer processing operation is part of a chemical mechanical planarization (CMP) processing system. The controller is configured to receive the one or more rotational velocity values from a user interface. The converter is configured to convert the energy output between a direct current (DC) waveform and an alternating current (AC) waveform.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a rotator assembly configured to control a rotational kinetic energy of a wafer-platen based on an electrical energy input;
   a controller configured to control the rotational kinetic energy of the wafer-platen, wherein a rotational velocity of the wafer-platen is either increased or decreased;
   a converter configured to generate an electrical energy output of the rotator assembly based on decreased rotational kinetic energy of the wafer-platen; and
   an energy storage device configured to store the electrical energy outputted by the rotator assembly based on the decreased rotational kinetic energy of the wafer-platen.

2. The device of claim 1, further comprising:
   a shaft configured to apply a torque and control the rotational velocity of the wafer-platen.

3. The device of claim 2, wherein the shaft is configured to be removably coupled with the wafer-platen.

4. The device of claim 1, wherein the wafer-platen is configured for a wafer processing system.

5. The device of claim 4, wherein the wafer processing system is part of a chemical mechanical planarization (CMP) processing system.

6. The device of claim 1, further comprising:
   a user interface configured to receive one or more rotational velocity values to either increase or decrease the rotational velocity of the wafer-platen.

7. The device of claim 6, wherein the rotator assembly is configured to receive the one or more rotational velocity values from the user interface.

8. A platen rotation device, comprising:
   a rotator assembly configured to receive an electrical energy input and control a rotational kinetic energy of a shaft coupled to the rotator assembly based on the electrical energy input;
   a wafer-platen configured to rotate based on the rotational kinetic energy input at the shaft;
   a controller configured to control the electrical energy input to the rotator assembly to increase electrical energy values or decrease the electrical energy values;
   a converter configured to generate an electrical energy output of the rotator assembly based on decreased rotational kinetic energy of the wafer-platen when the electrical energy values from the controller are decreased; and
   an energy storage device configured to supply the electrical energy input to the rotator assembly and receive the electrical energy generated from the decreased rotational kinetic energy of the wafer-platen.

9. The platen rotation device of claim 8, wherein the rotator assembly is configured to receive one or more rotational velocity values from the controller.

10. The platen rotation device claim 8, wherein the converter is configured to automatically switch between transferring energy from the energy storage device to the rotator assembly and transferring the decreased rotational kinetic energy to the energy storage device.

11. The platen rotation device of claim 8, wherein the converter is configured to switch between transferring energy from the energy storage device to the rotator assembly and transferring the decreased rotational kinetic energy to the energy storage device based on a control signal.

12. The platen rotation device of claim 8, further comprising:
a user interface switches between transferring energy from the energy storage device to the rotator assembly and transferring the decreased rotational kinetic energy to the energy storage device based on user input received through the user interface.

13. The platen rotation device of claim 8, further comprising:
a user interface increases the rotational kinetic energy to ramp up rotational velocity of the wafer-platen from zero to one or more rotational velocity values based on user input.

14. A device, comprising:
a rotator assembly configured to control a rotational kinetic energy of a wafer-platen based on an electrical energy input, wherein a rotational velocity of the wafer-platen is either increased or decreased;
a converter configured to generate an electrical energy output of the rotator assembly based on a decreased rotational kinetic energy of the wafer-platen when the rotational velocity is decreased; and
an energy storage device configured to store the electrical energy outputted by the rotator assembly based on the decreased rotational kinetic energy of the wafer-platen.

15. The device of claim 14, further comprising:
a controller configured to control the rotational kinetic energy of the wafer-platen based on one or more control signals transferred to the rotator assembly.

16. The device of claim 15, wherein the controller is configured to ramp up the rotational kinetic energy from zero to the one or more rotational velocity values or ramp down the rotational kinetic energy from the one or more rotational velocity values to zero.

17. The device of claim 15, wherein the controller is configured to perform a wafer processing operation that includes the wafer-platen rotating at the one or more rotational velocity values.

18. The device of claim 17, wherein the wafer processing operation is part of a chemical mechanical planarization (CMP) processing system.

19. The device of claim 15, wherein the controller is configured to receive the one or more rotational velocity values from a user interface.

20. The device of claim 14, wherein the converter is configured to convert the energy output between a direct current (DC) waveform and an alternating current (AC) waveform.

* * * * *